(12) United States Patent
Yokoyama

(10) Patent No.: US 6,704,334 B2
(45) Date of Patent: Mar. 9, 2004

(54) COMPACT SEMICONDUCTOR LASER DIODE MODULE

(75) Inventor: Yoshitaka Yokoyama, Kawasaki (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 10/378,302

(22) Filed: Mar. 3, 2003

(65) Prior Publication Data

US 2003/0169788 A1 Sep. 11, 2003

(30) Foreign Application Priority Data

Mar. 5, 2002 (JP) ........................................ 2002-058172

(51) Int. Cl.$^7$ ................................................ H01S 3/10
(52) U.S. Cl. ...................... 372/29.02; 372/31; 372/32
(58) Field of Search ........................ 372/29.02, 29.021, 372/31, 32, 29.011

(56) References Cited

U.S. PATENT DOCUMENTS

| 5,781,572 | A | | 7/1998 | Tahara et al. ................. 372/34 |
| 5,825,792 | A | | 10/1998 | Villeneuve et al. ........... 372/32 |
| 6,094,446 | A | | 7/2000 | Tei et al. ....................... 372/32 |
| 6,134,253 | A | * | 10/2000 | Munks et al. ................. 372/38 |
| 2001/0022793 | A1 | * | 9/2001 | Yokoyama ............... 372/29.02 |
| 2003/0099265 | A1 | * | 5/2003 | Harker .................... 372/29.02 |

FOREIGN PATENT DOCUMENTS

| JP | 04-157780 | 5/1992 | ........... H01S/3/133 |
| JP | 09-121070 | 5/1997 | ........... H01S/3/133 |
| JP | 09-219554 | 8/1997 | ........... H01S/3/133 |
| JP | 10-079723 | 3/1998 | ........... H04J/14/00 |
| JP | 10-209546 | 8/1998 | ............. H01S/3/13 |
| JP | 2001-257419 | 9/2001 | ......... H01S/5/0683 |

OTHER PUBLICATIONS

"32–Wavelength Tunable LD Module Built–in Multiwavelength Locker" Kai et al, *Communications Society Meeting of IEICE*, p. 397 2000 (no month).

* cited by examiner

Primary Examiner—James Davie
(74) Attorney, Agent, or Firm—Hayes Soloway P.C.

(57) ABSTRACT

In a semiconductor laser diode module including a semiconductor laser diode having a front facet for emitting a light beam, a collimating lens for receiving the light beam to generate a collimated light beam and a coupling lens for receiving the collimated light beam and converging the collimated light beam to an optical fiber, a bandpass filter is provided for receiving a first part of the collimated light beam, and a light detector is provided to have a first portion for receiving the first part of the collimated light beam through the bandpass filter and a second portion for receiving a second part of the collimated light beam. Thus, a wavelength of the semiconductor laser diode is controlled in accordance with an output signal of the first portion of the light detector, and a light intensity of the semiconductor laser diode is controlled in accordance with an output signal of the second portion of the light detector.

21 Claims, 20 Drawing Sheets

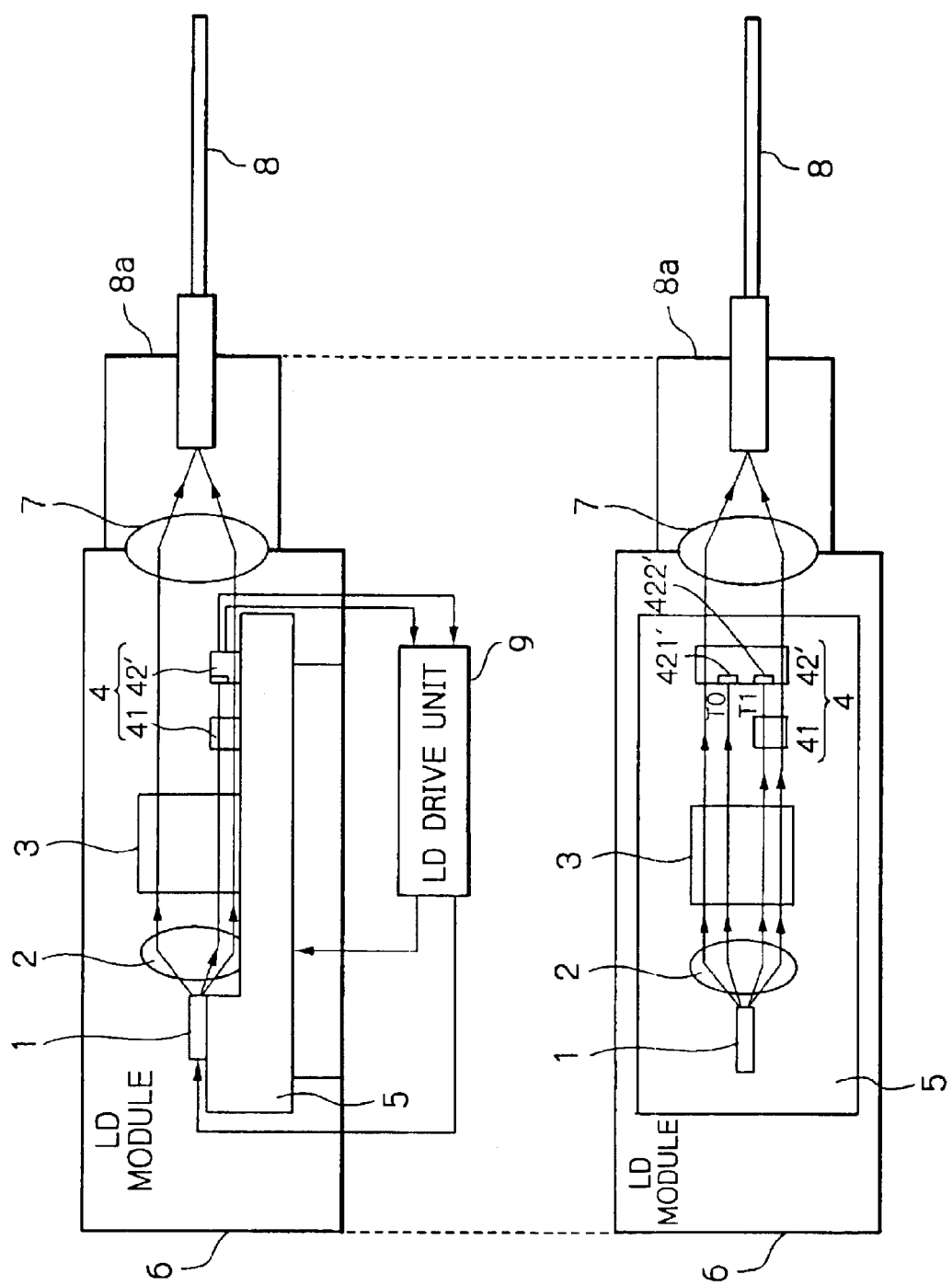

COMPACT SEMICONDUCTOR LASER DIODE MODULE

BACKGROUND OF THE INVENTION

1. Field of the Invention

The present invention relates to a semiconductor laser diode module capable of stabilizing the light intensity and wavelength of a semiconductor laser diode.

2. Description of the Related Art

Recently, semiconductor laser diodes have been used as light sources in high speed, long-distance and large capacity optical fiber communication systems. Particularly, for 10 km or more long-distance optical fiber communication systems, in order to suppress the effect of the wavelength dispersion, use is made of a single-axis mode semiconductor laser diode such as a distributed feedback (DFB)-type semiconductor laser diode which oscillates at a single wavelength.

In optical communications, it is important for the light intensity and wavelength of a light source to be constant. Generally, the light intensity and wavelength of a semiconductor laser diode are changed by the drive current and temperature, respectively, thereof. However, as the semiconductor laser diode deteriorates with time, the drive current is increased so as to slightly change the temperature of the semiconductor laser diode, so that the wavelength is also changed.

The above-mentioned slight wavelength change has hardly affected the conventional optical communication systems, however, this is fatal in dense wavelength division multiplexing (DWDM) optical communication systems where the pitch of wavelengths, i.e., the pitch of frequencies is very small, or 100 GHz or 50 GHz. In this case, the stability of wavelength is required to be <±50 pm. Therefore, light intensity- and wavelength-highly stabilized semiconductor laser diodes are required for such optical communication systems.

In a first prior art semiconductor laser diode module (see: JP-A-1-209546), an optical branching unit including a gradually-thickness-changed bandpass filter is externally provided to control the light intensity and wavelength of the semiconductor laser diode. This will be explained later in detail.

In the above-described first prior art semiconductor laser diode module, however, since the optical branching unit is externally provided, the entire apparatus including the semiconductor laser diode module is increased in size. Also, since the gradually-thickness-changed bandpass filter is expensive, the manufacturing cost is increased.

In a second prior art semiconductor laser diode module (see: JP-A-4-157780), an optical branching unit including a gradually-slope-changed bandpass filter and transmission/reflected light detectors is provided within the semiconductor laser diode module. As a result, the entire apparatus including the semiconductor laser diode module is decreased in size. This also will be explained later in detail.

In the above-described second prior art semiconductor laser diode module, however, since the slope of the bandpass filter is gradually changed by a sloping mechanism, the control of slope of the bandpass filter is complex. Also, since use is made of a rear-facet light beam to control the light intensity and wavelength, the second prior art semiconductor laser module cannot be applied to a face emitting semiconductor laser diode or a wavelength tunable semiconductor laser diode array, and also, the availability of light beams is decreased.

In a third prior art semiconductor laser diode module (see: JP-A-10-79723), an optical branching unit including a gradually-slope-changed bandpass filter and two transmission light detectors is provided within the semiconductor laser diode module. As a result, the entire apparatus including the semiconductor laser diode module is decreased in size. This also will be explained later in detail.

Even in the above-described third prior art semiconductor laser diode module, however, since the slope of the bandpass filter is gradually changed by a sloping mechanism, the control of slope of the bandpass filter is complex. Also, since use is made of a rear-facet light beam to control the light intensity and wavelength, the third prior art semiconductor laser module cannot be applied to a face emitting semiconductor laser diode or a wavelength tunable semiconductor laser diode array, and also, the availability of light beams is decreased.

In a fourth prior art semiconductor laser diode module (see: JP-A-2001-257419), an optical branching unit including a bandpass filter, a transmission light detector and a direct light detector is provided within the semiconductor laser diode module. As a result, the entire apparatus including the semiconductor laser diode module is also decreased in size. This also will be explained later in detail.

Even in the above-described fourth prior art semiconductor laser diode module, however, since use is made of a rear-facet light beam to control the light intensity and wavelength, the fourth prior art semiconductor laser module cannot be applied to a face emitting semiconductor laser diode or a wavelength tunable type semiconductor laser diode array, and also, the availability of light beams is decreased.

In a fifth prior art semiconductor laser diode module (see: JP-A-9-219554), an optical branching unit including a coupler (beam splitter), two bandpass filters and two light detectors is provided within the semiconductor laser diode module. As a result, the entire apparatus including the semiconductor laser diode module is decreased in size. This also will be explained later in detail.

In the above-described fifth prior art semiconductor laser diode module, however, since the beam splitter is incorporated thereinto, the size of the module is increased. Also, since the two bandpass filters are provided, the manufacturing cost of the module is increased. Further, since use is made of a rear-facet light beam to control the light intensity and wavelength, the fifth prior art semiconductor laser module cannot be applied to a face emitting semiconductor laser diode or a wavelength tunable semiconductor laser diode array, and also, the availability of light beams is decreased.

In a sixth prior art semiconductor laser diode module (see: JP-A-9-121070), an optical branching unit including a coupler (beam splitter), a bandpass filter and two light detectors as well as a coupler (beam splitter) for an optical fiber is provided within the semiconductor laser diode module. As a result, the entire apparatus including the semiconductor laser diode module is decreased in size. This also will be explained later in detail.

In the above-described sixth prior art semiconductor laser diode module, however, since the two beam splitters are incorporated thereinto, the size of the module is increased.

In a seventh prior art semiconductor laser diode module (see: Y. Kai et al., "32-wavelength Tunable LD Module Built-in Multi-wavelength Locker", Communications Society Meeting of IEICE, p. 397, 2000), the two beam splitters of the sixth prior art semiconductor laser diode module are replaced by a 3-way prism-type beam splitter. This also will be explained later in detail.

In the above-described seventh semiconductor laser diode module, however, since the prism-type beam splitter is incorporated thereinto, the size of the semiconductor laser diode module is still increased.

SUMMARY OF THE INVENTION

It is an object of the present invention to provide a compact semiconductor laser diode module without beam splitters.

According to the present invention, in a semiconductor laser diode module including a semiconductor laser diode having a front facet for emitting a light beam, a collimating lens for receiving the light beam to generate a collimated light beam and a coupling lens for receiving the collimated light beam and converging the collimated light beam to an optical fiber, a bandpass filter is provided for receiving a first part of the collimated light beam, and a light detector is provided to have a first portion for receiving the first part of the collimated light beam through the bandpass filter and a second portion for directly receiving a second part of the collimated light beam. Thus, a wavelength of the semiconductor laser diode is controlled in accordance with an output signal of the first portion of the light detector, and a light intensity of the semiconductor laser diode is controlled in accordance with an output signal of the second portion of the light detector.

BRIEF DESCRIPTION OF THE DRAWINGS

The present invention will be more clearly understood from the description set forth below, as compared with the prior art, with reference to the accompanying drawings, wherein:

FIG. 14A is a side view illustrating a second embodiment of the semiconductor laser diode module according to the present invention;

FIG. 14B is a plan view of the semiconductor laser diode module of FIG. 14A;

DESCRIPTION OF THE PREFERRED EMBODIMENTS

Before the description of the preferred embodiments, prior art semiconductor laser diode modules will be explained with reference to FIGS. 1, 2, 3, 4, 5, 6, 7, 8, 9, 10, 11 and 12.

Figure 1:
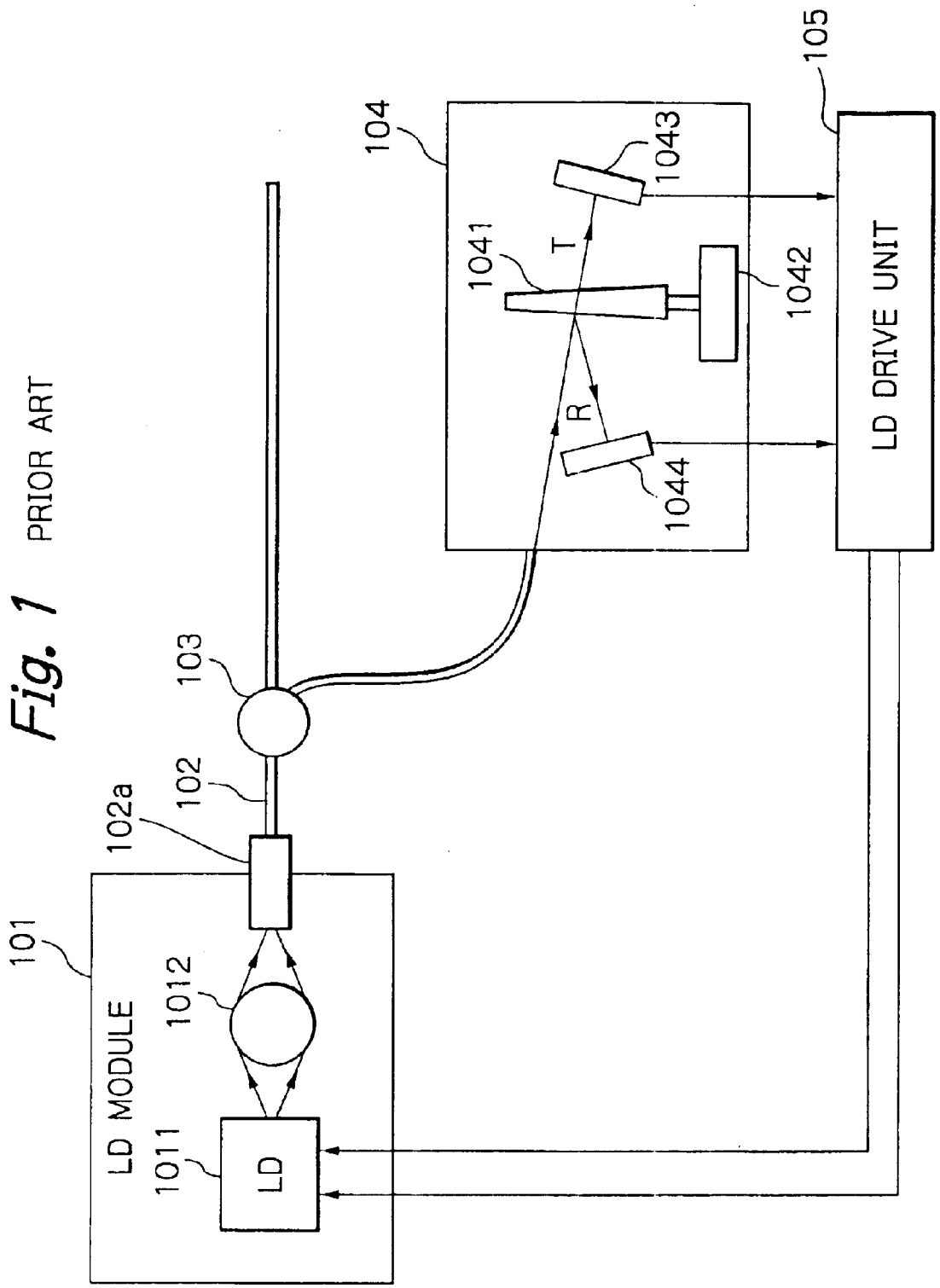
FIG. 1 is a diagram illustrating a first prior art semiconductor laser diode module.

In FIG. 1, which illustrates a first prior art semiconductor laser diode module (see: JP-A-10-209546), a semiconductor laser module 101 is constructed by a semiconductor laser diode 1011 for emitting a light beam for emitting which is converged by a coupling lens 1012 to reach an optical fiber 102. Note that the optical fiber 102 is fixed by a cylindrical member 102a to the module.

Provided at the optical fiber 102 is a coupler (beam splitter) 103 for splitting a part of the light beam which reaches an optical branching unit 104 which is connected to a laser diode (LD) drive unit 105 for controlling the light intensity and wavelength of the semiconductor laser diode 1011. The LD drive unit 105 is constructed by a microcomputer, for example.

The optical branching unit 104 is constructed by a bandpass filter 1041 such as an etalon, a slide mechanism 1042 for adjusting the location of the bandpass filter 1041, a transmission light detector 1043 and a reflected light detector 1044.

Figure 2:
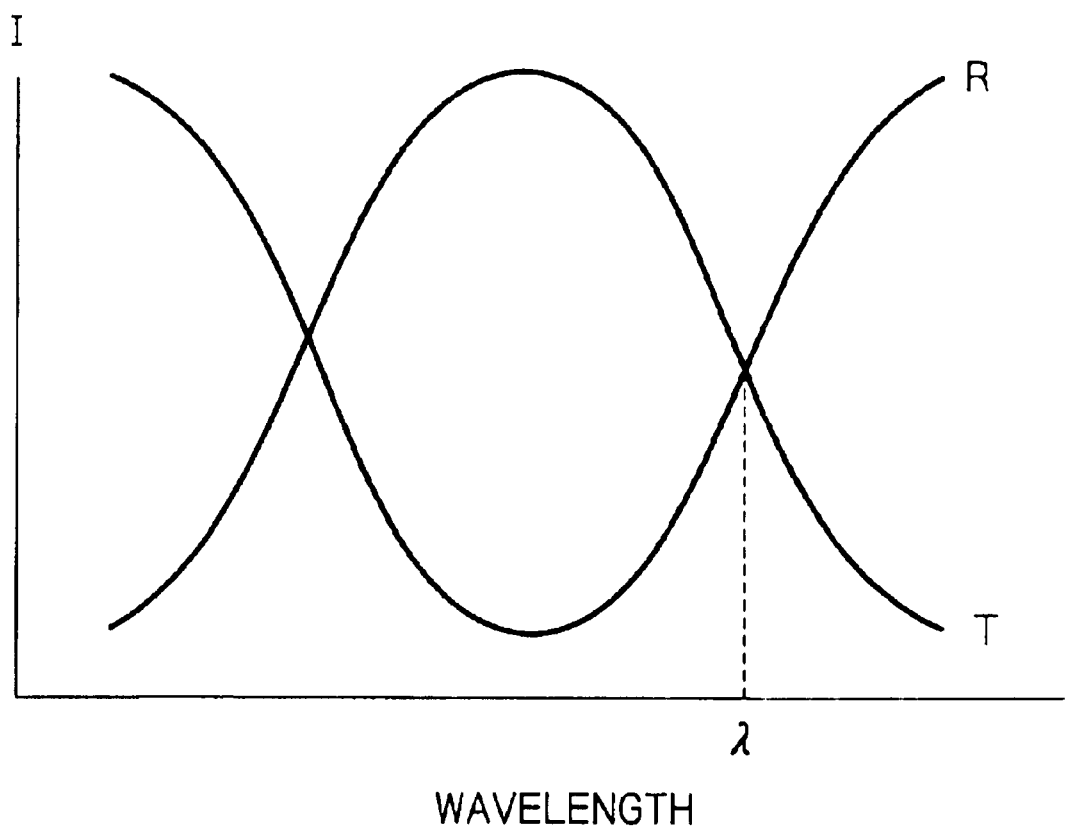
FIG. 2 is a graph showing the transmission/reflection characteristics of the bandpass filter of FIG. 1.

The transmission/reflection characteristics of the bandpass filter 1041 are shown in FIG. 2. That is, the transmission characteristics of the bandpass filter 1041 are different from the reflection characteristics of the bandpass filter 1041. Therefore, if a target wavelength is indicated by λ in FIG. 2, the LD drive unit 105 controls the temperature of the semiconductor laser diode 1011 so that the output signal of the transmission light detector 1043 is brought close to the output signal of the reflected light detector 1044.

The thickness of the bandpass filter 1041 is gradually changed along the motion direction of the slide mechanism 1042. Therefore, the target wavelength λ can be adjusted by the slide mechanism 1042.

On the other hand, the LD drive unit 105 controls a drive current of the semiconductor laser diode 1011 in accordance with the sum of the output signals of the detectors 1043 and 1044.

In the semiconductor laser diode module 101 of FIG. 1, however, since the optical branching unit 104 for controlling the light intensity and wavelength of the semiconductor laser diode loll is externally provided, the entire apparatus including the semiconductor laser diode module 101, the coupler 103 and the optical branding unit 104 is increased in size. Also, since the thickness of the bandpass filter 1041 is gradually changed so that the bandpass filter 1041 is expensive, the manufacturing cost is also increased.

Figure 3:
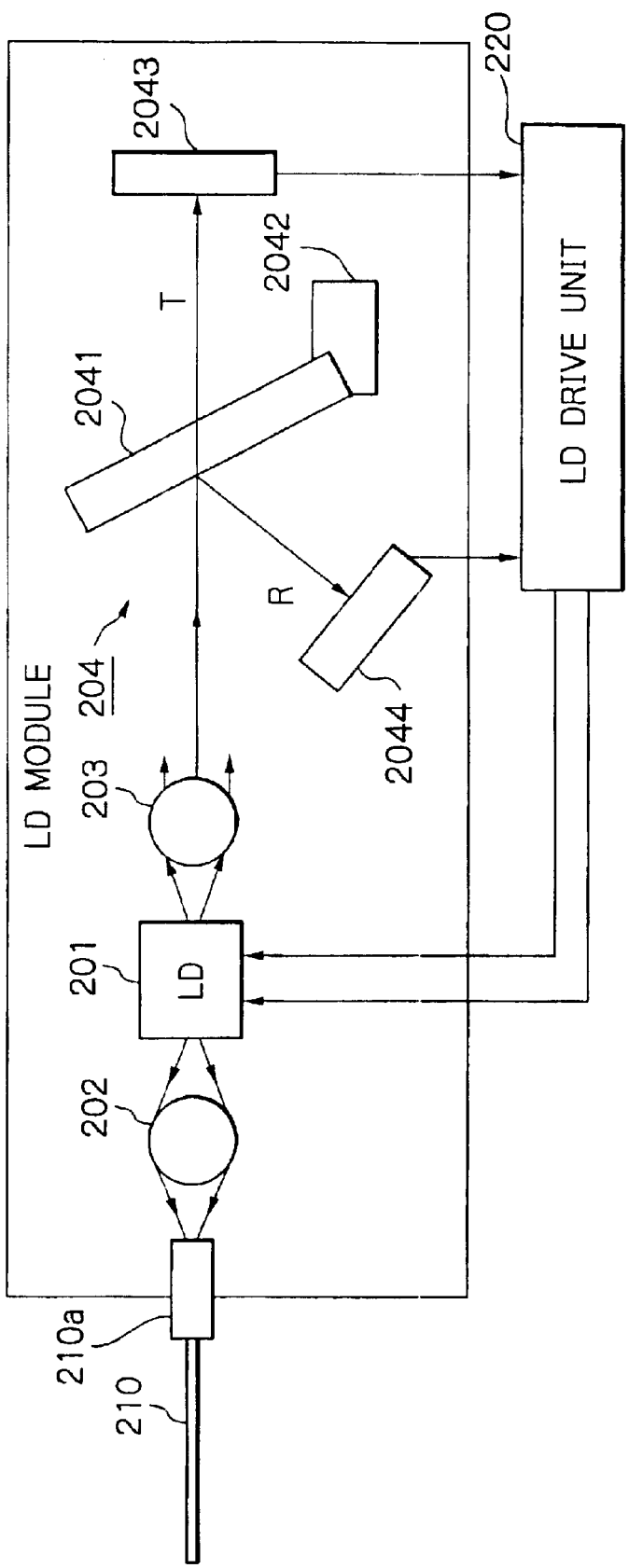
FIG. 3 is a diagram illustrating a second prior art semiconductor laser diode module.

In FIG. 3, which illustrates a second prior art semiconductor laser diode module (see; JP-A-4-157780), a semiconductor laser module is constructed by a semiconductor laser diode 201 having a front facet for emitting a light beam which is converged by a coupling lens 202 to reach an optical fiber 210. Note that the optical fiber 210 is fixed by a cylindrical member 210a to the module. Also, the semiconductor laser diode 201 has a rear facet for emitting a light beam which is transmitted to reach an optical branching unit 204 which is connected to an LD drive unit 220 for controlling the light intensity and wavelength of the semiconductor laser diode 201. The LD drive unit 220 is constructed by a microcomputer, for example.

The optical branching unit 204 is constructed by a bandpass filter 2041 such as an etalon, a sloping mechanism 2042 for adjusting the slope of the bandpass filter 2041, a transmission light detector 2043 and a reflected light detector 2044.

The transmission/reflection characteristics of the bandpass filter 2041 are similar to those of the bandpass filter 1041 shown in FIG. 2. That is, the transmission characteristics of the bandpass filter 2041 are different from the reflection characteristics of the bandpass filter 2041. Therefore, if a target wavelength is indicated by λ in FIG. 2, the LD drive unit 220 controls the temperature of the semiconductor laser diode 201 so that the output signal of the transmission light detector 2043 is brought close to the output signal of the reflected light detector 2044.

The slope of the bandpass filter 2041 is gradually changed by the sloping mechanism 2042. Therefore, the target wavelength λ can be adjusted by the sloping mechanism 2042.

On the other hand, the LD drive unit 220 controls a drive current of the semiconductor laser diode 201 in accordance with the sum of the output signals of the detectors 2043 and 2044.

In the semiconductor laser diode module of FIG. 3, although the optical branching unit 204 for controlling the light intensity and wavelength of the semiconductor laser diode 201 is provided within the semiconductor laser module, the control of the slope of the bandpass filter 2041 is complex. Also, since use is made of the rear-facet light beam to control the light intensity and wavelength, the semiconductor laser module of FIG. 3 cannot be applied to a face emitting semiconductor laser diode or wavelength tunable semiconductor laser diode array, and the availability of light beams is decreased.

Figure 4:
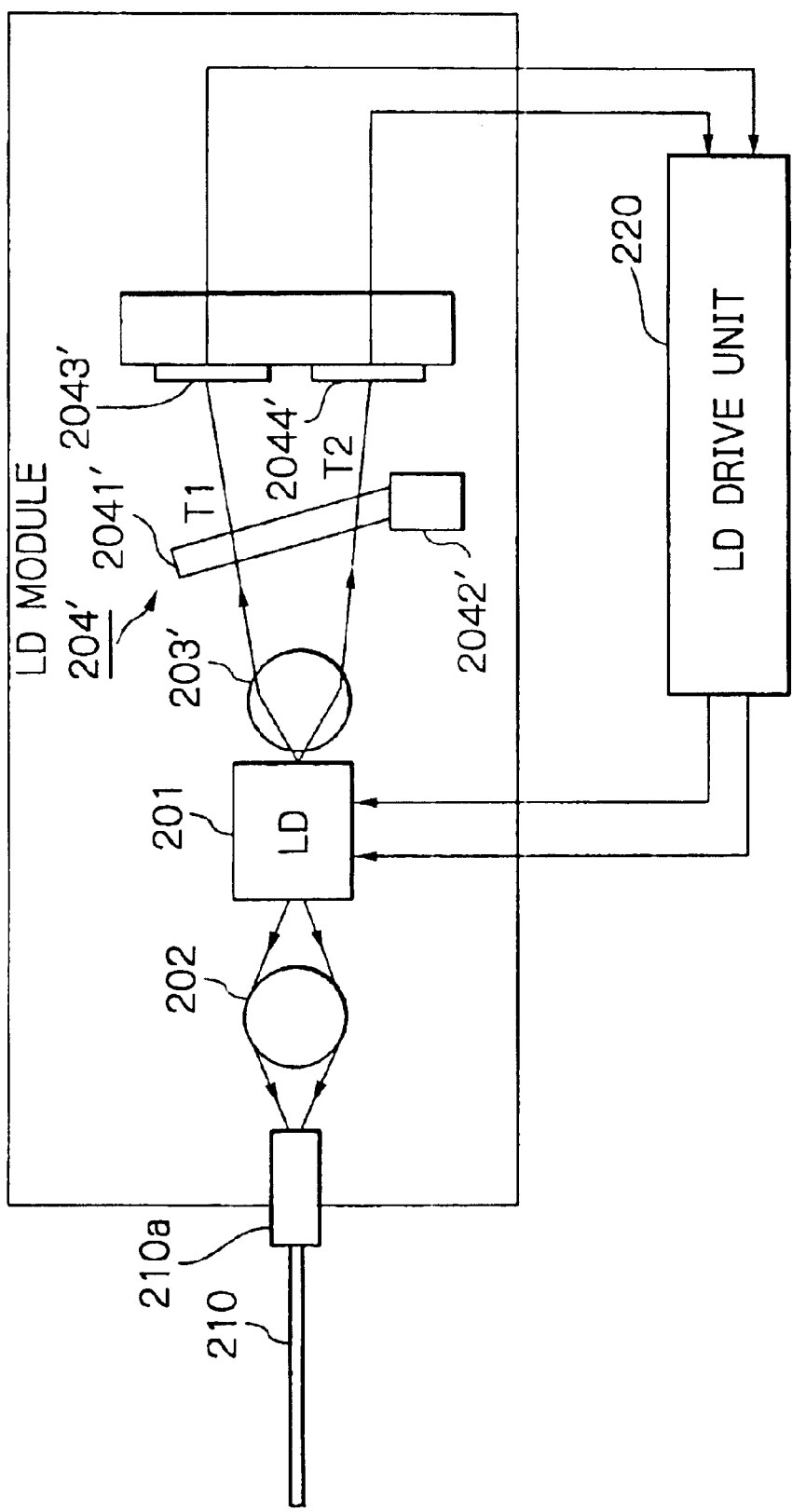
FIG. 4 is a diagram illustrating a third prior art semiconductor laser diode module.

In FIG. 4, which illustrates a third prior art semiconductor laser diode module (see: JP-A-10-79723), the collimating lens 203 of FIG. 3 is replaced by a radiating lens 203' and the optical branching unit 204 of FIG. 3 is replaced by an optical branching unit 204'.

The radiating lens 203' radiates the light beam from the rear facet of the semiconductor laser diode 201, so that two light beams T1 and T2 are incident at different angles to the optical branching unit 204'.

The optical branching unit 204' is constructed by a bandpass filter 2041' such as an etalon, a sloping mechanism 2042' for adjusting the slope of the bandpass filter 2041', a transmission light detector 2043' and a transmission light detector 2044'.

Figure 5:
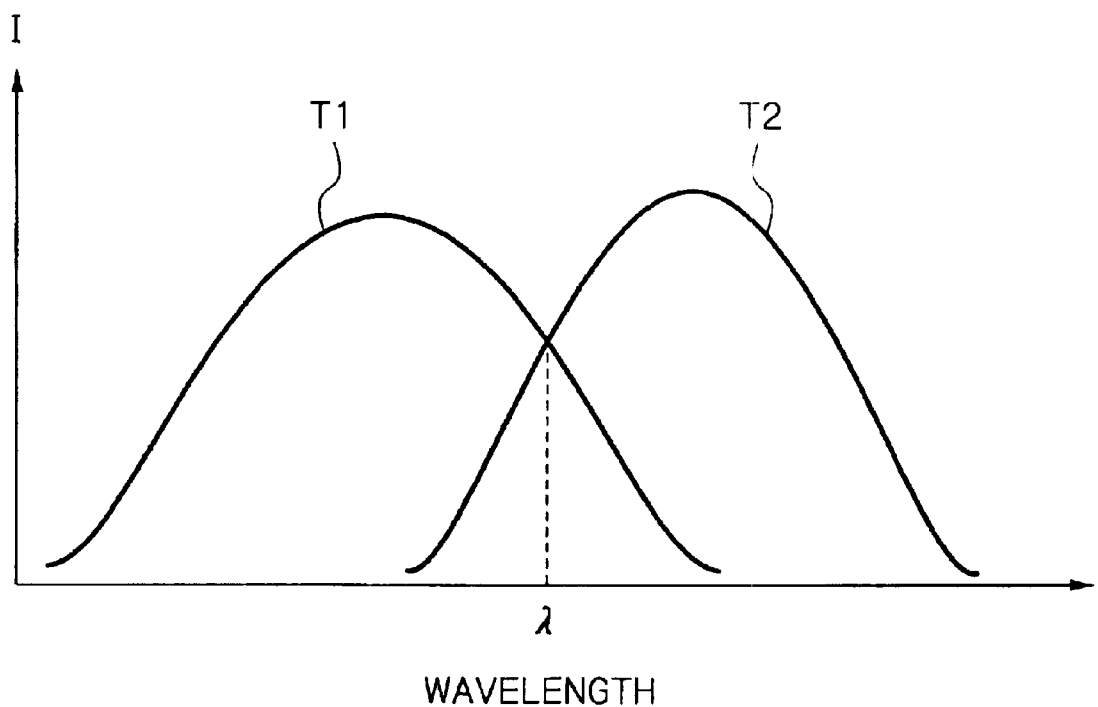
FIG. 5 is a graph showing the transmission characteristics of the bandpass filter of FIG. 4.

The transmission characteristics of the bandpass filter 2041' are shown in FIG. 5. That is, the transmission characteristics of the light beam T1 are different from the transmission characteristics of the light beam T2. Therefore, if a target wavelength is indicated by λ in FIG. 5, the LD drive unit 220 controls the temperature of the semiconductor laser diode 201 so that the output signal of the transmission light detector 2043' is brought close to the output signal of the reflected light detector 2044'.

The slope of the bandpass filter 2041' is gradually changed by the sloping mechanism 2042'. Therefore, the target wavelength λ can be adjusted by the sloping mechanism 2042'.

On the other hand, the LD drive unit 220 controls a drive current of the semiconductor laser diode 201 in accordance with the sum of the output signals of the detectors 2043' and 2044'.

In the semiconductor laser diode module of FIG. 4, although the optical branching unit 204' for controlling the light intensity and wavelength of the semiconductor laser diode 201 is provided within the semiconductor laser module, the control of the slope of the bandpass filter 2041' is complex. Also, since use is made of the rear-facet light beam to control the light intensity and wavelength, the semiconductor laser module of FIG. 4 cannot be applied to a face emitting semiconductor laser diode or a wavelength tunable semiconductor laser diode array, and the availability of light beams is decreased.

Figure 6:
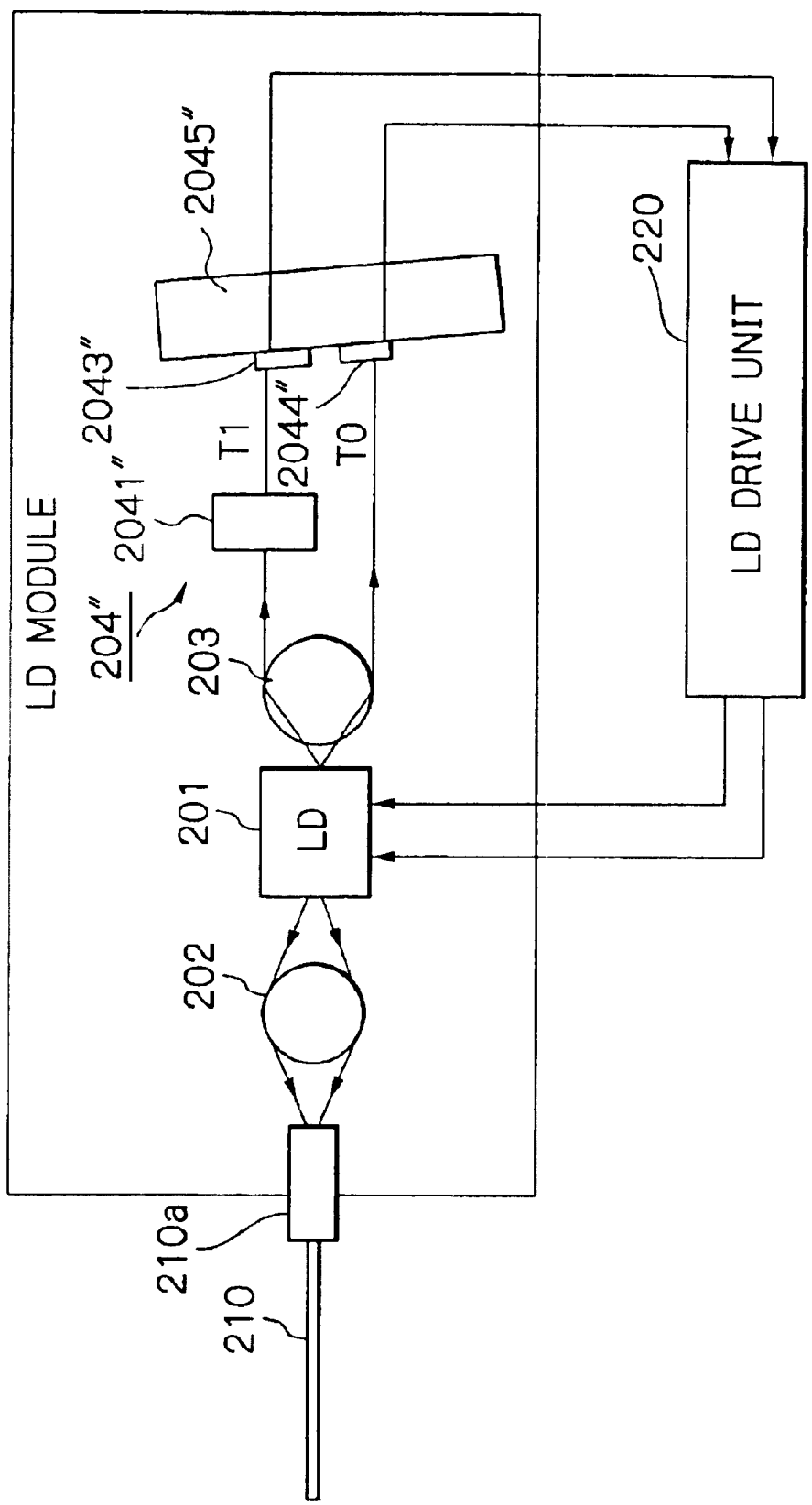
FIG. 6 is a diagram illustrating a fourth prior art semiconductor laser diode module.

In FIG. 6, which illustrates a fourth prior art semiconductor laser diode module (see: JP-A-2001-257419), the optical branching unit 204 of FIG. 3 is replaced by an optical branching unit 204".

The optical branching unit 204" is constructed by a bandpass filter 2041" such as a multi-layer filter, a transmission light detector 2043" and a direct light detector 2044". Note that the direct light detector 2044" directly receives a light beam T0 from the collimating lens 203. Also, a base 2045" for mounting the detectors 2043" and 2044" is sloped so as to suppress return light therefrom to the semiconductor laser diode 201.

Figure 7:
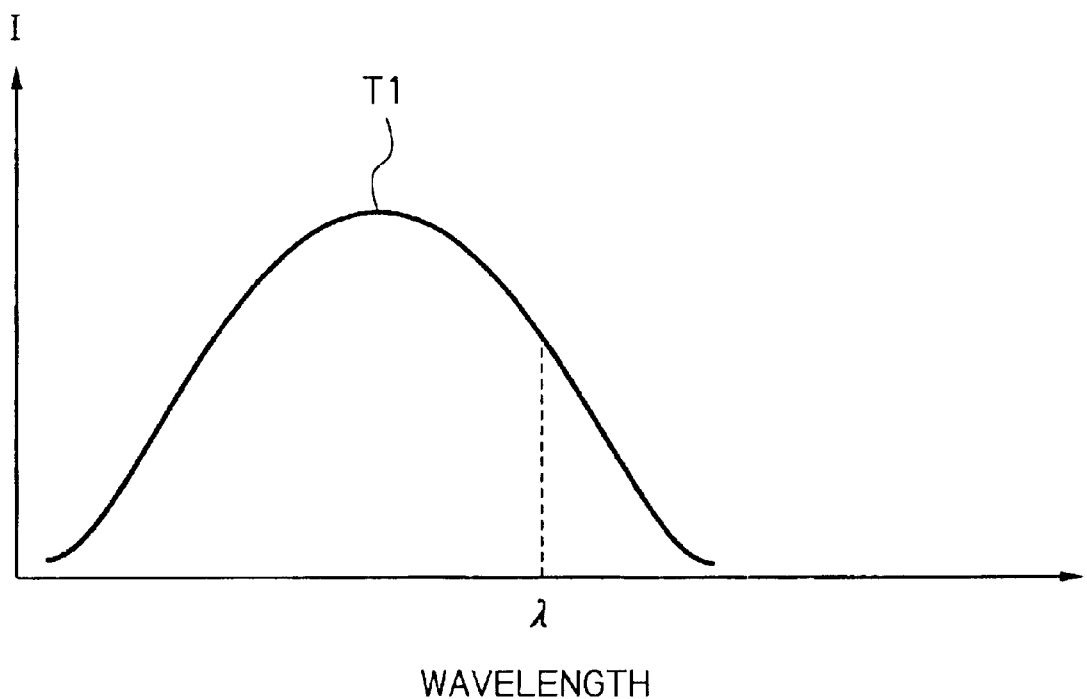
FIG. 7 is a graph showing the transmission characteristics of the bandpass filter of FIG. 6.

The transmission characteristics of the bandpass filter 2041" are shown in FIG. 7. That is, the transmission characteristics of the light beam T1 depend on the wavelength of the light beam of the collimating lens 203. Therefore, if a target wavelength is indicated by λ in FIG. 7, the LD drive unit 220 controls the temperature of the semiconductor laser diode 201 so that the output signal of the transmission light detector 2043" is brought close to a predetermined value.

On the other hand, the LD drive unit 220 controls a drive current of the semiconductor laser diode 201 in accordance with the output signal of the detector 2044".

Even in the semiconductor laser diode module of FIG. 6, although the optical branching unit 204" for controlling the light intensity and wavelength of the semiconductor laser diode 201 is provided within the semiconductor laser module, since use is made of the rear-facet light beam to control the light intensity and wavelength, the semiconductor laser module of FIG. 6 cannot be applied to a face emitting semiconductor laser diode or a wavelength tunable semiconductor laser diode array, and the availability of light beams is decreased.

Figure 8:
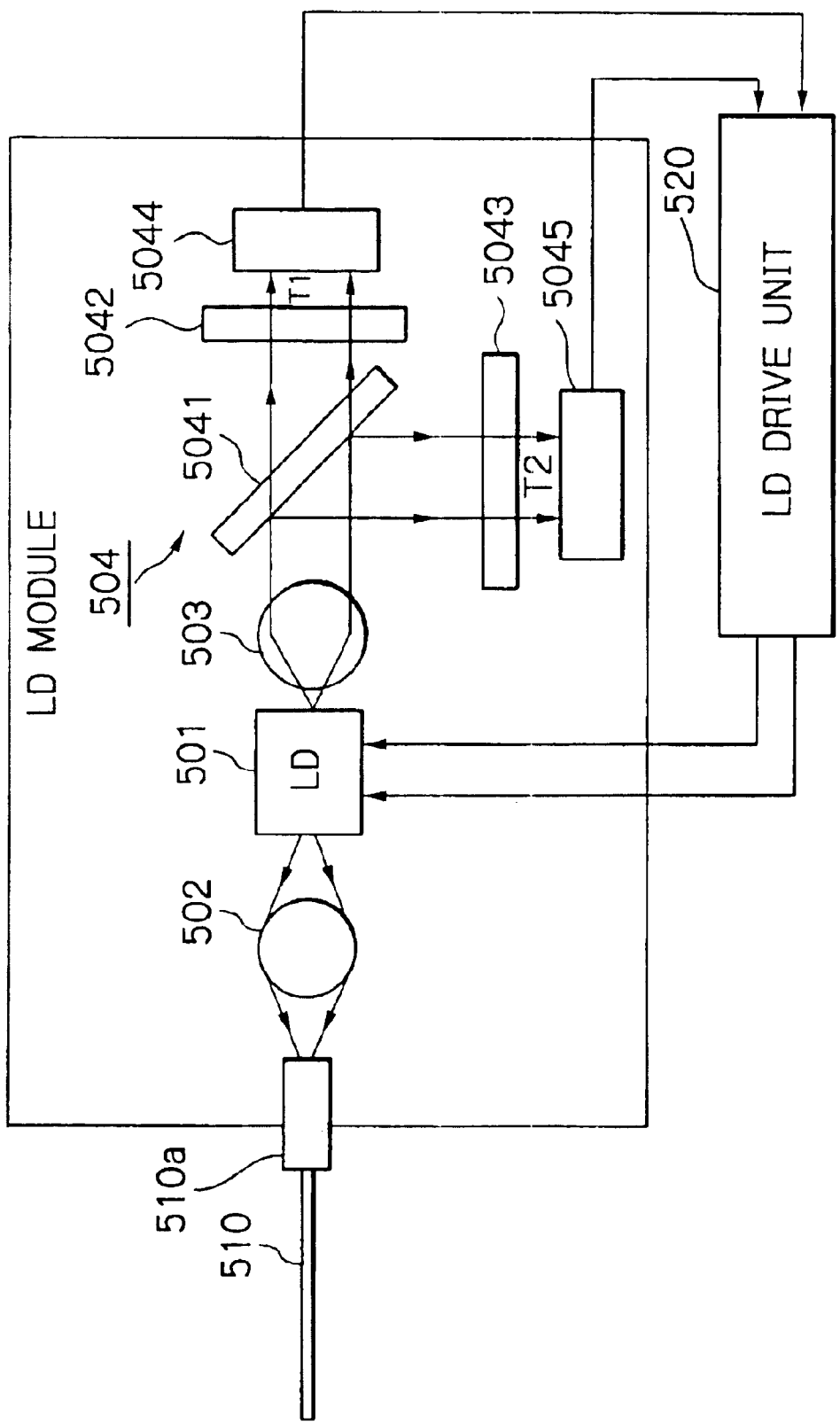
FIG. 8 is a diagram illustrating a fifth prior art semiconductor laser diode module.

In FIG. 8, which illustrates a fifth prior art semiconductor laser diode module (see: JP-A-9-219554), a semiconductor laser module is constructed by a semiconductor laser diode 501 having a front facet for emitting a light beam which is converged by a coupling lens 502 to reach an optical fiber 510. Note that the optical fiber 510 is fixed by a cylindrical member 510a to the module. Also, the semiconductor laser diode 501 has a rear facet for emitting a light beam which is transmitted via a collimating lens 503 to reach an optical branching unit 504 which is connected to an LD drive unit 520 for controlling the light intensity and wavelength of the semiconductor laser diode 501. The LD drive unit 520 is constructed by a microcomputer, for example.

The optical branching unit 504 is constructed by a coupler (beam splitter) 5041, a bandpass filter 5042 such as an etalon for receiving a light beam transmitted from the beam splitter 5041, a bandpass filter 5043 such as an etalon for receiving a light beam reflected by the beam splitter 5041, a light detector 5044 for detecting a light beam transmitted from the bandpass filter 5042, and a light detector 5045 for detecting a light beam transmitted from the bandpass filter 5043.

Figure 9:
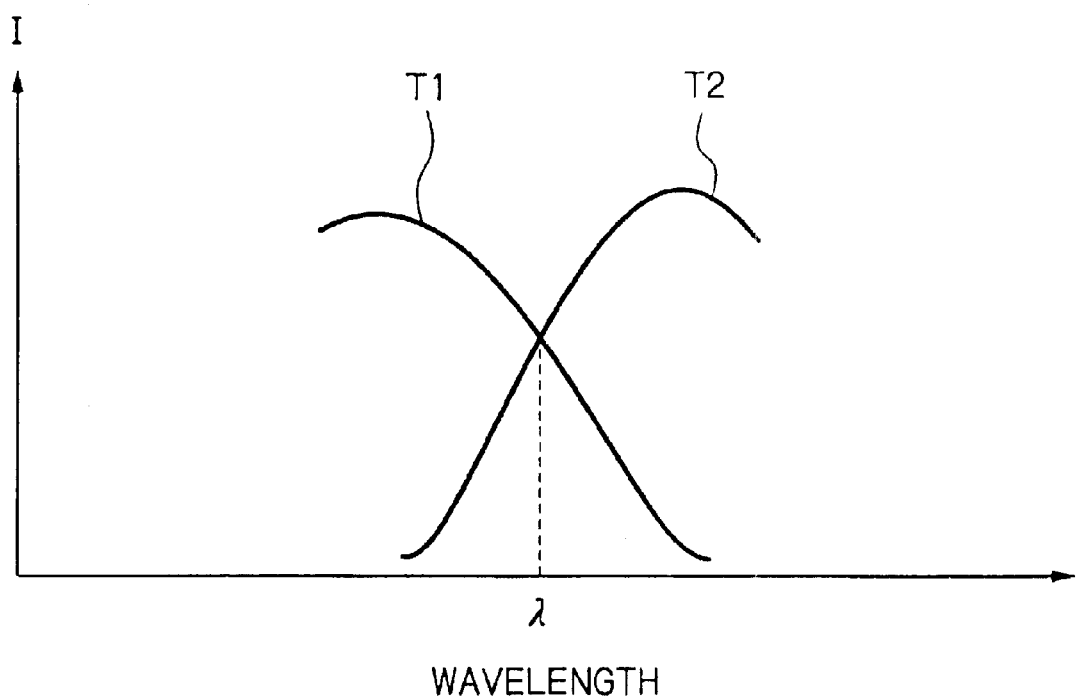
FIG. 9 is a graph showing the transmission characteristics of the bandpass filter of FIG. 8.

The transmission characteristics of the bandpass filters 5042 and 5043 are shown in FIG. 9. That is, the transmission characteristics of the bandpass filter 5042 are different from those of the bandpass filter 5043. Therefore, if a target wavelength is indicated by $\lambda$ in FIG. 9, the LD drive unit 520 controls the temperature of the semiconductor laser diode 501 so that the output signal of the light detector 5044 is brought close to the output signal of the light detector 5045.

On the other hand, the LD drive unit 520 controls a drive current of the semiconductor laser diode 501 in accordance with the sum of the output signals of the detectors 5044 and 5045.

In the semiconductor laser diode module of FIG. 8, although the optical branching unit 504 for controlling the light intensity and wavelength of the semiconductor laser diode 501 is provided within the semiconductor laser module, since the beam splitter 504 is incorporated into the semiconductor laser diode module, the size of the semiconductor laser diode module is increased. Also, since the two bandpass of filters 5042 and 5043 are provided, the manufacturing cost of the semiconductor laser diode module is increased. Further, since use is made of the rear-facet light beam to control the light intensity and wavelength, the semiconductor laser module of FIG. 8 cannot be applied to a face emitting semiconductor laser diode or a wavelength tunable semiconductor laser diode array, and the availability of light beams is decreased.

Figure 10:
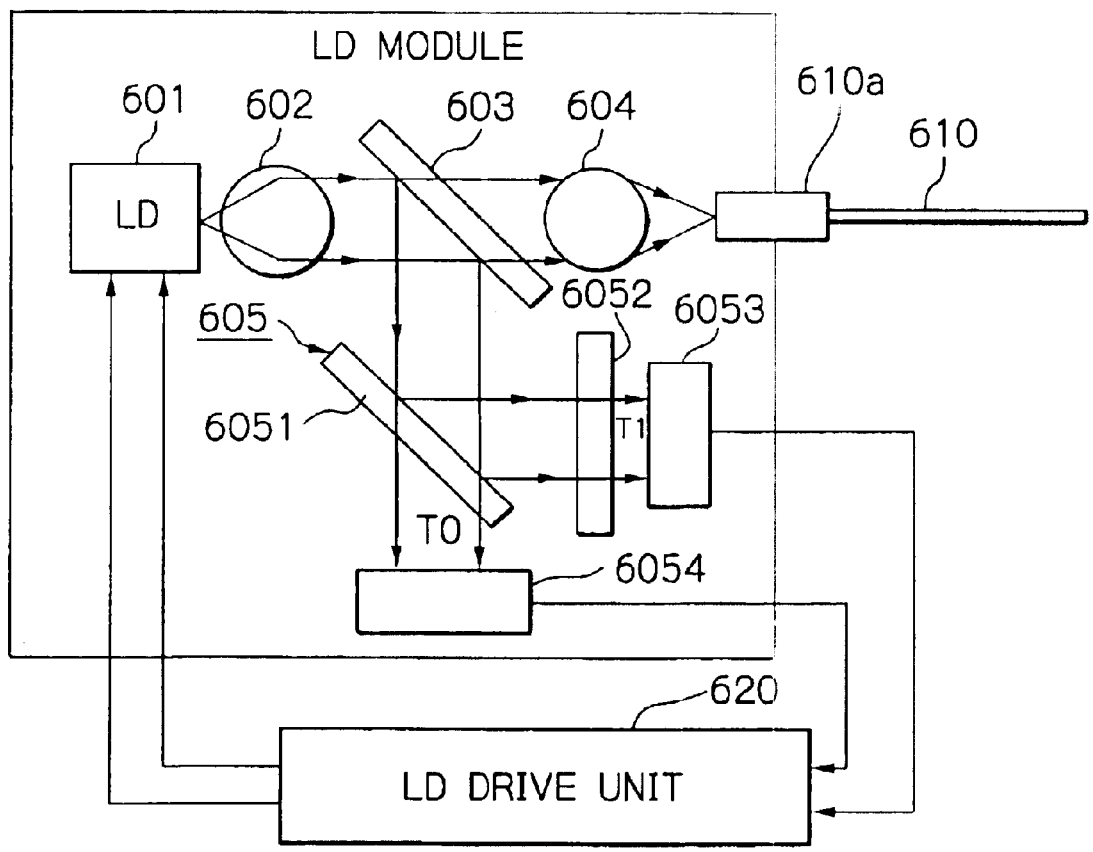
FIG. 10 is a diagram illustrating a sixth prior art semiconductor laser diode module.

In FIG. 10, which illustrates a sixth prior art semiconductor laser diode module (see: JP-A-9-121070), a semiconductor laser module is constructed by a semiconductor laser diode 601 having a front facet for emitting a light beam which is transmitted via a collimating lens 602 to reach a coupler (beam splitter) 603.

A transmission light beam of the beam splitter 603 is further transmitted by a coupling lens 604 to an optical fiber 610. Note that the optical fiber 610 is fixed by a cylindrical member 610a to the module.

On the other hand, a reflected light beam of the beam splitter 603 is transmitted to reach an optical branching unit 605 which is connected to an LD drive unit 620 for controlling the light intensity and wavelength of the semiconductor laser diode 601. The LD drive unit 620 is constructed by a microcomputer, for example.

The optical branching unit 605 is constructed by a coupler (beam splitter) 6051, a bandpass filter 6052 such as an etalon for receiving a light beam reflected from the beam splitter 6051, a light detector 6053 for detecting a light beam transmitted from the bandpass filter 6052, and a light detector 6053 for detecting a light beam transmitted from the beam splitter 6051.

Figure 11:
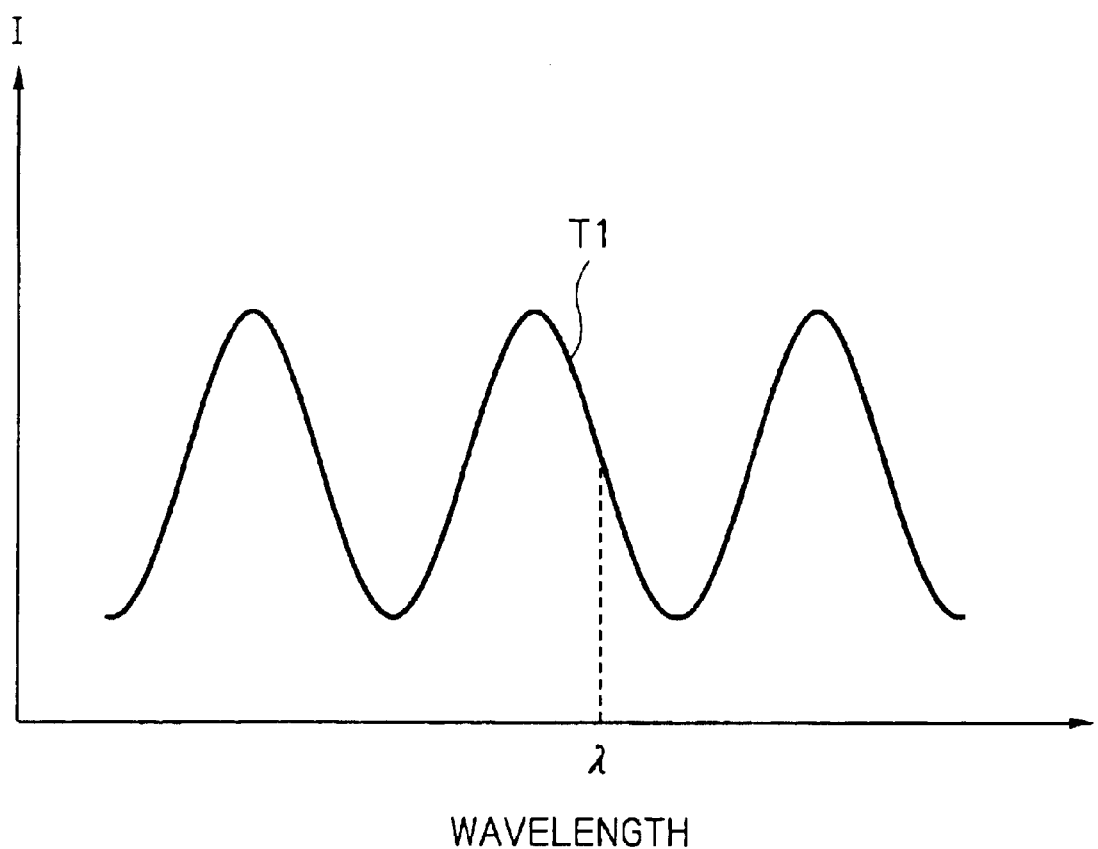
FIG. 11 is a graph showing the transmission characteristics of the bandpass filter of FIG. 10.

The transmission characteristics of the bandpass filter 6052 are shown in FIG. 11. Therefore, if a target wavelength is indicated by $\lambda$ in FIG. 11, the LD drive unit 620 controls the temperature of the semiconductor laser diode 601 so that the output signal of the light detector 6043 is brought close to a predetermined value.

On the other hand, the LD drive unit 620 controls a drive current of the semiconductor laser diode 601 in accordance with the output signal of the detector 6054.

In the semiconductor laser diode module of FIG. 10, although the optical branching unit 605 for controlling the light intensity and wavelength of the semiconductor laser diode 501 is provided within the semiconductor laser module, since the beam splitters 603 and 6051 are incorporated into the semiconductor laser diode module, the size of the semiconductor laser diode module is increased.

Figure 12:
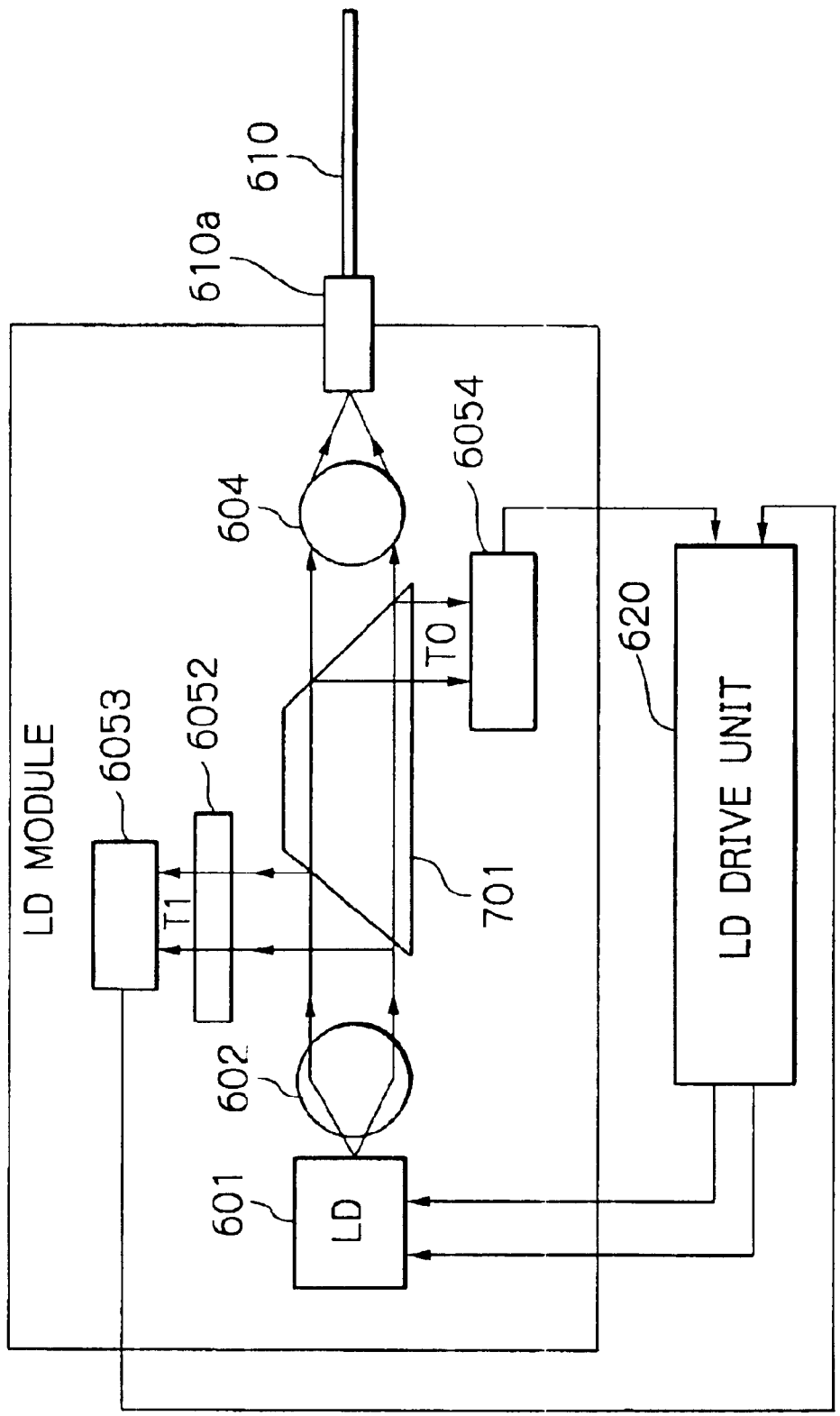
FIG. 12 is a diagram illustrating a seventh prior art semiconductor laser diode module.

In FIG. 12, which illustrates a seventh prior art semiconductor laser diode module (see: Y. Kai et al., "32-wavelength Tunable LD Module Built-in Multi-wavelength Locker", Communications Society Meeting of IEICE, p. 397, 2000), the beam splitters 603 and 6051 of FIG. 10 are replaced by a 3-way prism-type coupler (beam splitter) 701. That is, a light beam reflected from a first face of the prism-type beam splitter 701 is received by the light detector 6053 via the bandpass filter 6052, while, a light beam reflected from a second face of the prism-type beam splitter 701 is received by the light detector 6054. Also, a transmission light beam of the prism-type beam splitter 701 reaches the optical fiber 610 via the coupling lens 604.

In the semiconductor laser diode module of FIG. 12, since the prism-type beam splitter 701 is incorporated thereinto, the size of the semiconductor laser diode module is still increased.

Figures 13A, 13B:
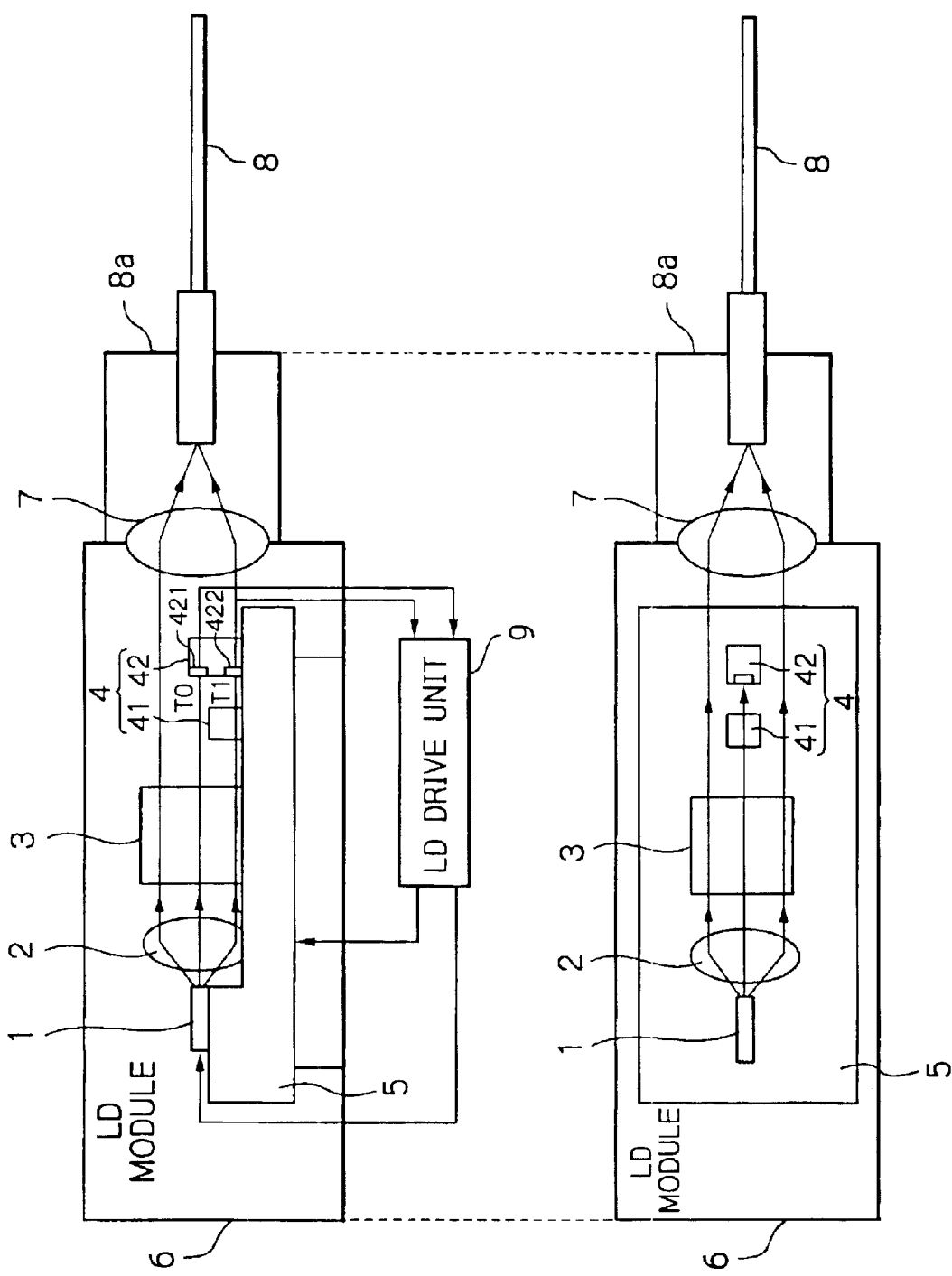
FIG. 13A is a side view illustrating a first embodiment of the semiconductor laser diode module according to the present invention.
FIG. 13B is a plan view of the semiconductor laser diode module of FIG. 13A.

FIG. 13A is a side view illustrating a first embodiment of the semiconductor laser diode module according to the present invention, and FIG. 13B is a plan view of the semiconductor laser diode module of FIG. 13A. In FIGS. 13A and 13B, a semiconductor laser diode 1, a collimating lens 2, an isolator 3, and an optical branching unit 4 formed by a solid type bandpass filter 41 and a light detector 42 are mounted on a temperature-controlled substrate 5 formed by a Peltier element which is fixed to a case 6. Also, a coupling lens 7 is mounted on the case 6 so that a light beam from the semiconductor laser diode 1 is converged to an optical fiber 8. Note that the optical fiber 8 is fixed by a cylindrical member 8a to the case 6.

The optical branching unit 4 is connected to an LD drive unit 9 for controlling the light intensity and wavelength of the semiconductor laser diode 1. The LD drive unit 9 is constructed by a microcomputer, for example.

In the optical branching unit 4, the bandpass filter 41 is constructed by a multi-layer filter having single-peak transmission characteristics T1 as shown in FIG. 7 or an etalon having periodic transmission characteristics T1 as shown in FIG. 11. Also, the light detector 42 has an upper light receiving portion 421 for receiving a light beam T0 directly from the isolator 3 and a lower light receiving portion 422 for receiving a light beam T1 via the bandpass filter 41 from the isolator 3.

In FIGS. 13A and 13B, most of a light beam emitted from a front facet of the semiconductor laser diode 1 is transmitted via the collimating lens 2, the isolator 3 and the coupling lens 7 to the optical fiber 8. Also, a part of the light beam from the front facet of the semiconductor laser diode 1 is transmitted via the collimating lens 2 and the isolator 3 to the upper light receiving portion 421 of the light detector 42, so that the LD drive unit 9 controls a drive current of the semiconductor laser diode 1 in accordance with the output signal of the upper light receiving portion 421, thus controlling the light intensity of the semiconductor laser diode 1. Further, a part of the light beam from the front facet of the semiconductor laser diode 1 is transmitted via the collimating lens 2, the isolator 3 and the bandpass filter 41 to the lower light receiving portion 422, so that the LD drive unit 9 controls the temperature of the substrate 5 in accordance with the output signal of the lower light receiving portion 422. As a result, the wavelength of the semiconductor laser diode 1 is brought to a target wavelength λ as shown in FIG. 7 or T1.

Due to the presence of the isolator 2, return light from the bandpass filter 41 and the light detector 42 is completely suppressed.

Thus, in the semiconductor laser diode module of FIGS. 13A and 13B, since no beam splitter is provided therein, the module can be small in size.

FIG. 14A is a side view illustrating a second embodiment of the semiconductor laser diode module according to the present invention, and FIG. 14B is a plan view of the semiconductor laser diode module of FIG. 14A. In FIGS. 14A and 14B, the light detector 42 of FIGS. 13A and 13B is replaced by a light detector 42' which has a left light receiving portion 421' for receiving a light beam T0 directly from the isolator 3 and a right light receiving portion 422' for receiving a light beam T1 via the bandpass filter 41 from the isolator 3.

The operation of the semiconductor laser diode module of FIGS. 14A and 14B is the same as that of the semiconductor laser diode module of FIGS. 13A and 13B.

Thus, even in the semiconductor laser diode module of FIGS. 14A and 14B, since no beam splitter is provided therein, the module can be small in size.

Figure 15:
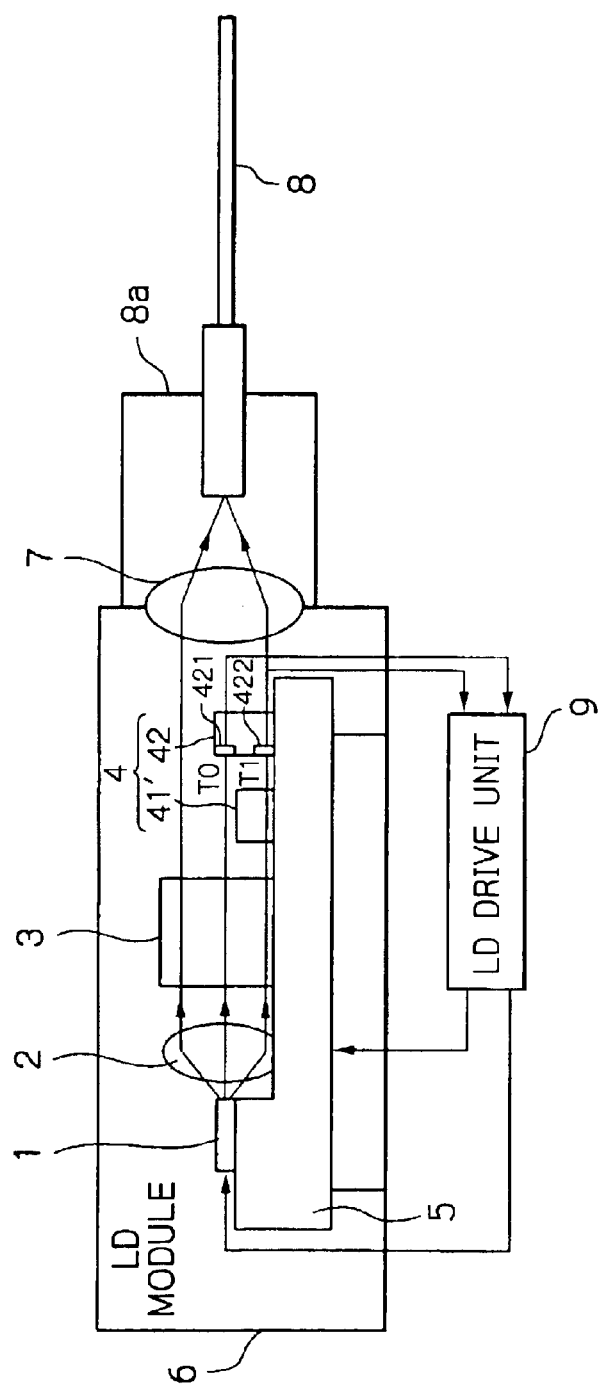
FIG. 15 is a side view illustrating a third embodiment of the semiconductor laser diode module according to the present invention.
Figure 16:
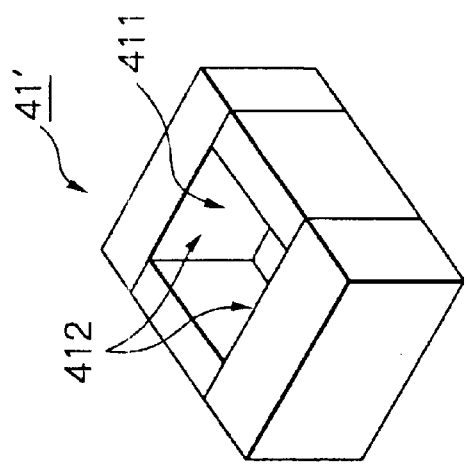
FIG. 16 is a perspective view of the bandpass filter of FIG. 15.

In FIG. 15, which illustrates a third embodiment of the semiconductor laser diode module according to the present invention, the bandpass filter 41 of FIG. 13A is replaced by an air-gap type etalon 41' which has an air gap 411 serving as an resonator and reflecting faces 412 as illustrated in FIG. 16. Due to the presence of the air gap 411, although the air-gap type etalon 41' is a little longer than the conventional etalon, the air-gap type elalon 41' has a smaller temperature coefficient than the conventional etalon. Thus, the semiconductor laser diode module of FIG. 15 is more thermally-stable than the semiconductor laser diode module of FIG. 13A.

Note that the air-gap type etalon 41' of FIG. 15 can be applied to the semiconductor laser diode module of FIG. 14A.

Figure 17:
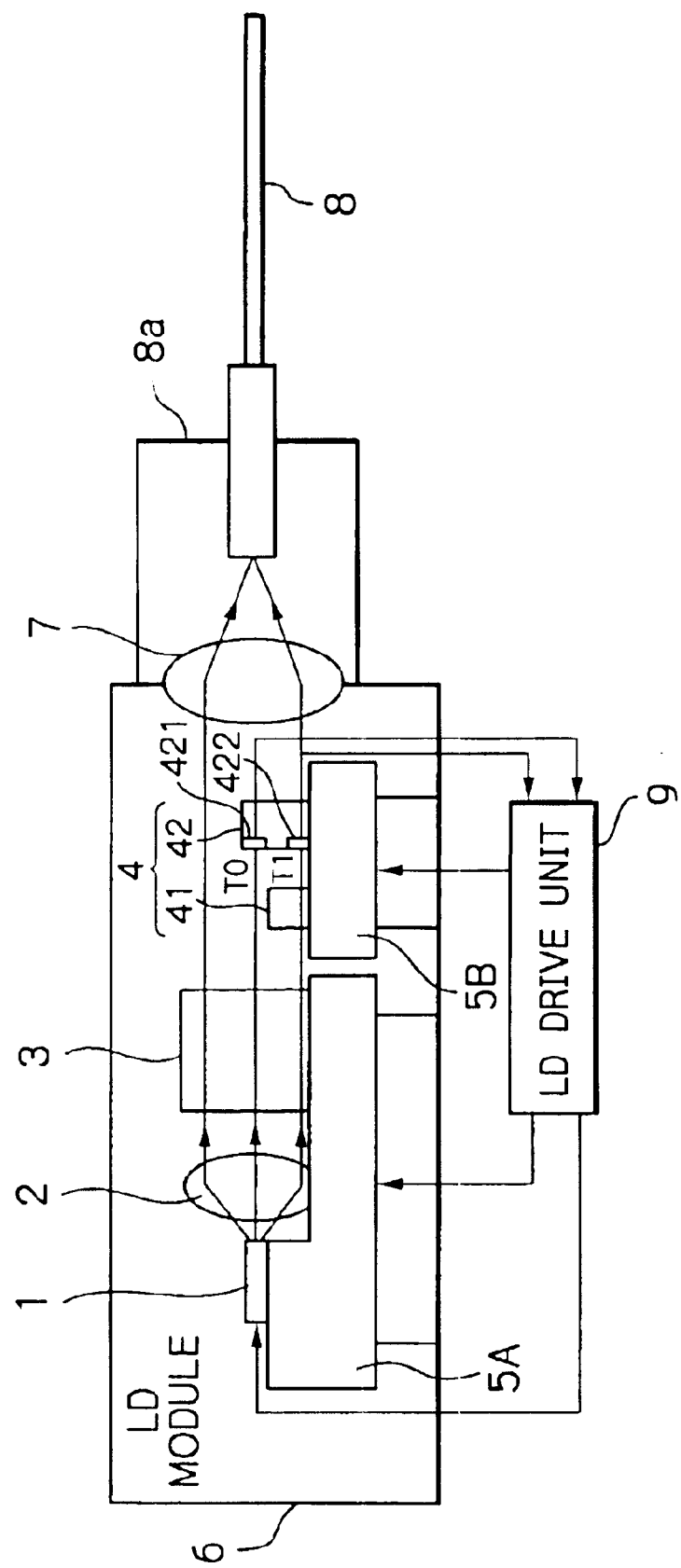
FIG. 17 is a side view illustrating a fourth embodiment of the semiconductor laser diode module according to the present invention.

In FIG. 17, which illustrates a fourth embodiment of the present invention, the temperature-controlled substrate 5 of FIG. 7A is divided into temperature-controlled substrates 5A and 5B each formed by a Peltier element. In this case, the semiconductor laser diode 1, the collimating lens 2 and the isolator 3 are mounted on the substrate 5A, while the optical branching unit 4 is mounted on the substrate 5B.

The temperature of the substrate 5A is controlled by the LD drive unit 9 in accordance with the output signal of the lower light receiving portion 422, while the temperature of the substrate 5B is controlled by the LD drive unit 9 to a predetermined value. As a result, even when the bandpass filter 41 has a large temperature coefficient, the character-istics of the banpass filter 41 is stable. Also, since each of the substrates 5A and 5B is smaller than the substrate 5 of FIG. 13, the entire power consumption can be decreased.

Note that the substrates 5A and 5B of FIG. 17 can be applied to the semiconductor laser diode module of FIG. 14A.

Figure 18:
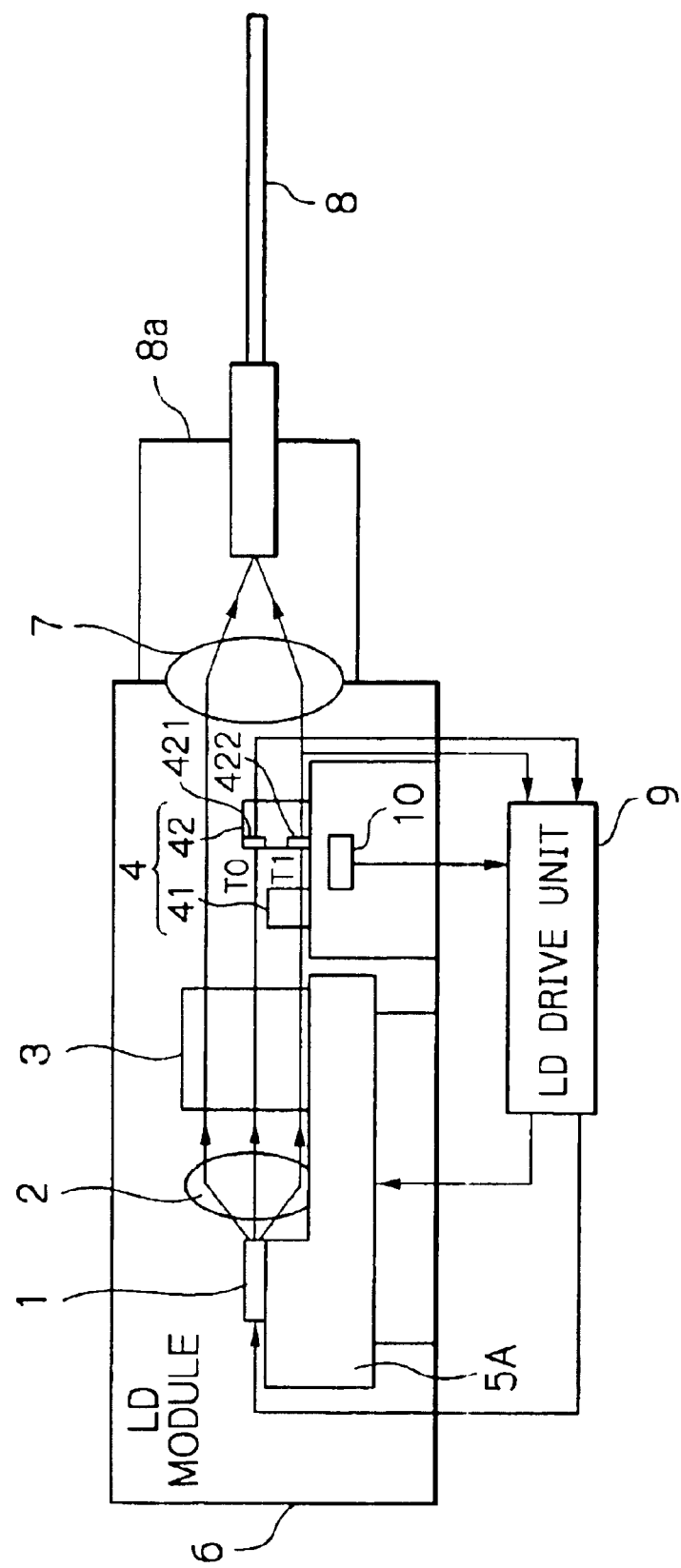
FIG. 18 is a side view illustrating a fifth embodiment of the semiconductor laser diode module according to the present invention.
Figure 19:
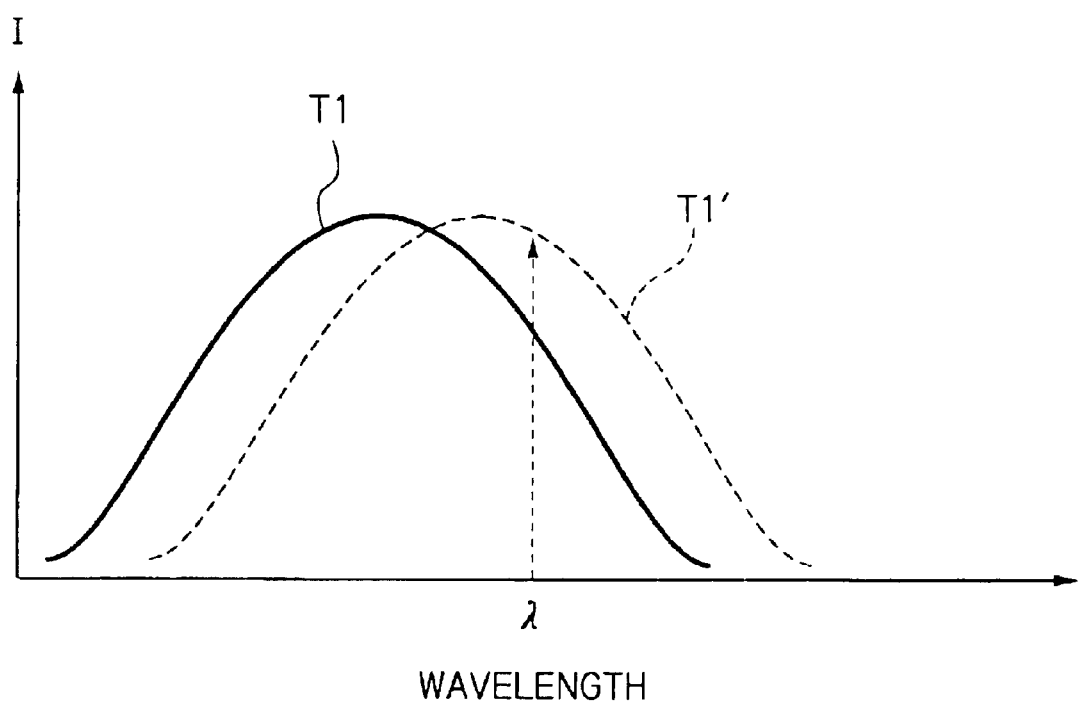
FIG. 19 is a diagram showing the characteristics of the bandpass filter of FIG. 18 depending the temperature.

In FIG. 18, which illustrates a fifth embodiment of the present invention, the substrate 5B of FIG. 17 is removed, and a temperature sensor 10 formed by a thermistor is provided near the bandpass filter 41. For example, if the temperature of the bandpass filter 41 is increased, the transmission characteristics of the bandpass filter 41 are changed from T1 to T1' as shown in FIG. 19. Therefore, the LD drive unit 9 corrects the output signal of the lower light receiving portion 422 by $$\text{OUT422} \leftarrow \alpha(T) \cdot \text{OUT422}$$

where OUT422 is the output signal of the lower light receiving portion 422;

α(T) is a variable determined by the temperature T detected by the temperature sensor 10. As a result, even when the bandpass filter 41 has a large temperature coefficient, the characteristics of the bandpass filter 41 depending upon the temperature can be compensated for.

Note that the configuration of FIG. 18 can be applied to the semiconductor laser diode module of FIG. 14A.

Figure 20:
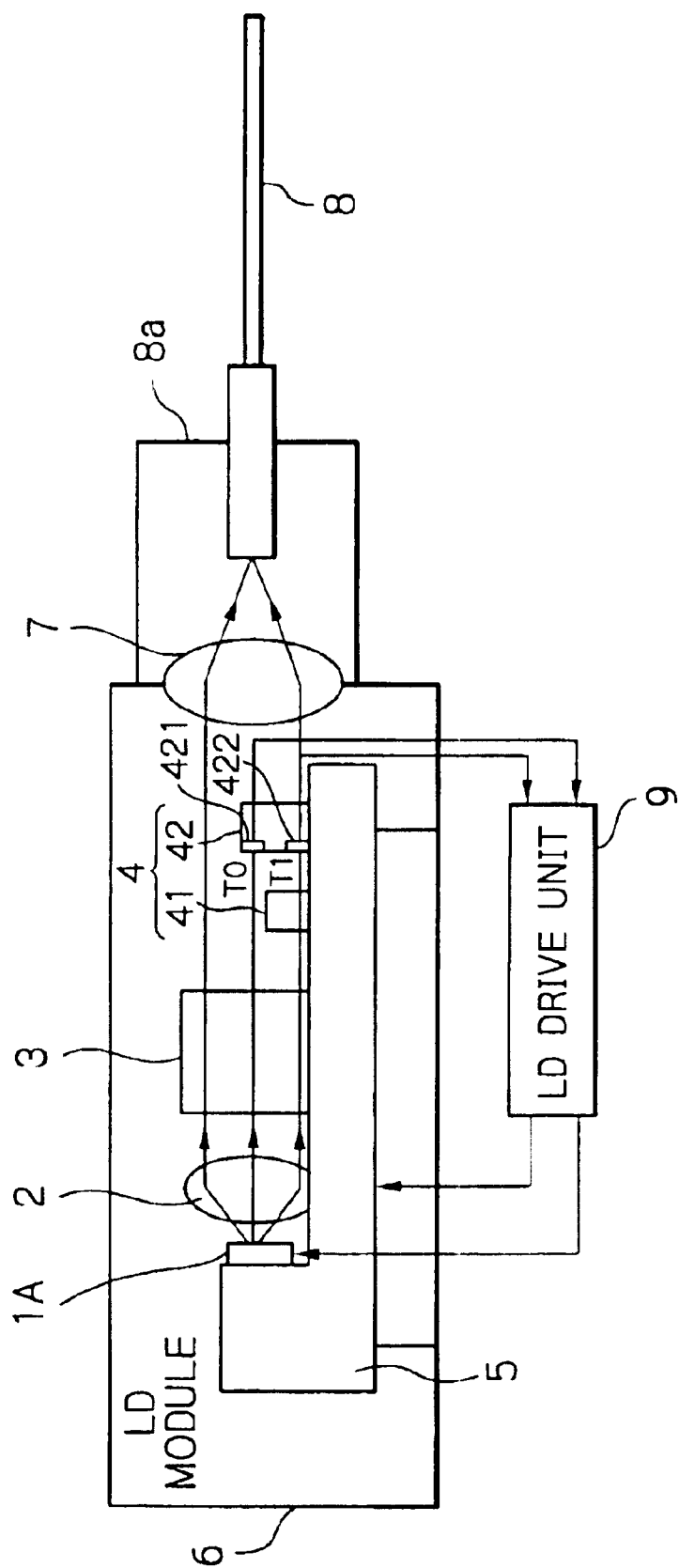
FIG. 20 is a side view illustrating a sixth embodiment of the semiconductor laser diode module according to the present invention.

In FIG. 20, which illustrates a sixth embodiment of the present invention, the semiconductor laser diode 1 of FIG. 13A is replaced by a surface emitting semiconductor laser diode 1A. Note that the surface emitting semiconductor laser diode 1A has been recently developed and can be of a wavelength tunable type combined with an external resonator by a micromachine. Since the surface emitting semiconductor laser diode 1A has only a front facet with no rear facet, a monitoring light beam for the optical branching unit 4 as well as a signal light beam for the optical fiber 8 is needed to be generated from the front facet. Even in this case, the present invention is applied to such a surface emitting semiconductor laser diode.

Note that the configuration type of FIG. 20 can be applied to the semiconductor laser diode module of FIG. 14A.

Figure 21:
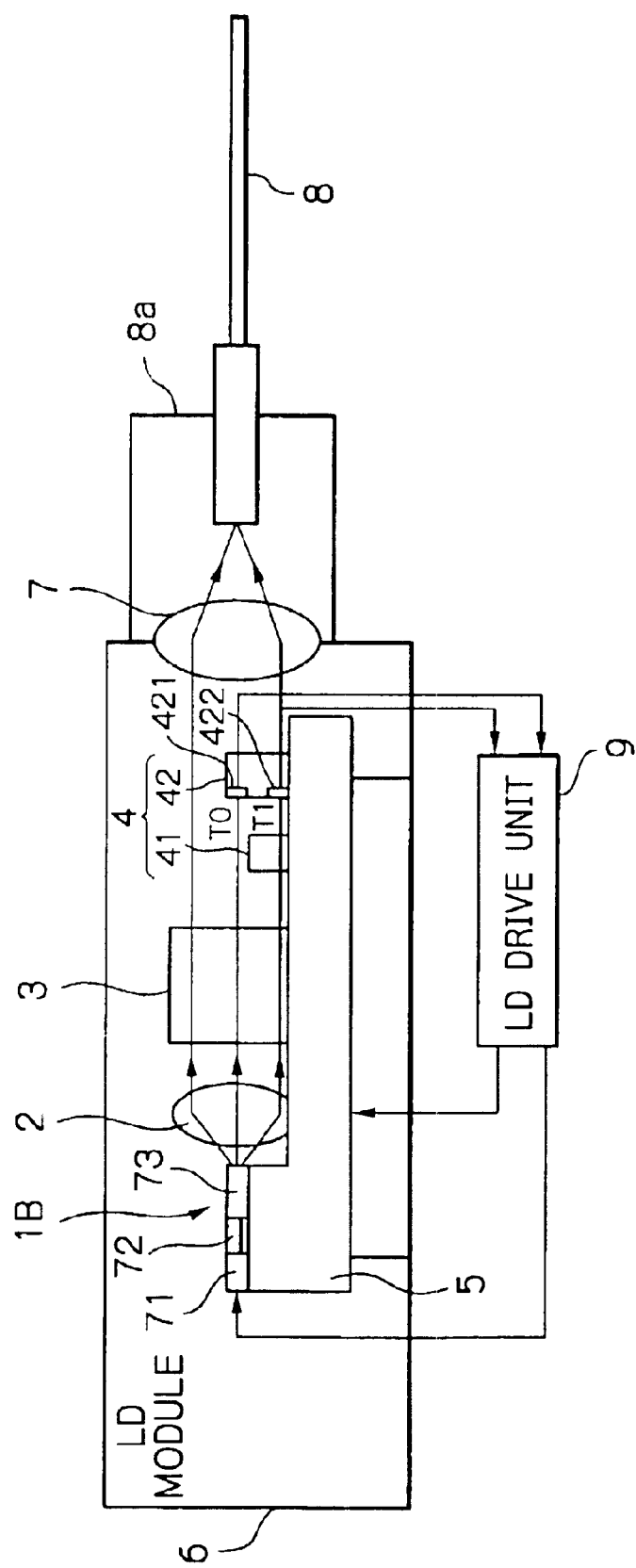
FIG. 21 is a side view illustrating a seventh embodiment of the semiconductor laser diode module according to the present invention.

In FIG. 21, which illustrates a seventh embodiment of the present invention, the semiconductor laser diode 1 of FIG. 13A is replaced by a wavelength tunable semiconductor laser diode array 1B which is constructed by a plurality of DFB-type semiconductor laser diodes 71, a light combine 72 and an optical amplifier 73. Note that the wavelength tunable semiconductor laser diode array 1B has been recently developed in DMDM optical communication systems. Since the wavelength tunable semiconductor laser diode array 1B has only a front facet with no rear facet, a monitoring light beam for the optical branching unit 4 as well as a signal light beam for the optical fiber 8 is needed to be generated from the front facet. Even in this case, the present invention is applied to such a wavelength tunable semiconductor laser diode array. Note that the wavelength tunable semiconductor laser diode array 1B can be of a distributed Brag reflector (DBR) type or of an external resonator type.

Note that the configuration type of FIG. 21 can be applied to the semiconductor laser diode module of FIG. 14A.

In the above-described embodiments, the LD drive unit 9 is externally provided; however, the LD drive unit 9 can be incorporated into the semiconductor laser diode module.

As explained hereinabove, a semiconductor laser diode module according to the present invention can be decreased in size, since no beam splitter is introduced thereinto.

What is claimed is:

1. A semiconductor laser diode module comprising:
   a semiconductor laser diode having a front facet for emitting a light beam;
   a collimating lens for receiving said light beam to generate a collimated light beam;
   a coupling lens for receiving said collimated light beam and converging said collimated light beam to an optical fiber;
   a bandpass filter for receiving a first part of said collimated light beam; and
   a light detector having a first portion for receiving said first part of said collimated light beam through said bandpass filter and a second portion for directly receiving a second part of said collimated light beam,
   so that a wavelength of said semiconductor laser diode is controlled in accordance with an output signal of the first portion of said light detector, and a light intensity of said semiconductor laser diode is controlled in accordance with an output signal of the second portion of said light detector.

2. The semiconductor laser diode module as set forth in claim 1, further comprising an isolator interposed between said collimating lens and said bandpass filter.

3. The semiconductor laser diode module as set forth in claim 1, further comprising a temperature-controlled substrate mounting said semiconductor laser diode, said collimating lens, said bandpass filter and said light detector,
   a temperature of said temperature-controlled substrate being controlled in accordance with the output signal of the second portion of said light detector to control the light intensity of said semiconductor laser diode.

4. The semiconductor laser diode module as set forth in claim 3, wherein the first and second portions of said light detector are arranged perpendicular to a surface of said temperature-controlled substrate.

5. The semiconductor laser diode module as set forth in claim 3, wherein the first and second portions of said light detector are arranged in parallel with a surface of said temperature-controlled substrate.

6. The semiconductor laser diode module as set forth in claim 1, further comprising:
   a first temperature-controlled substrate mounting said semiconductor laser diode and said collimating lens; and
   a second temperature-controlled substrate mounting said bandpass filter and said light detector,
   a temperature of said first temperature-controlled substrate being controlled in accordance with the output signal of the second portion of said light detector to control the light intensity of said semiconductor laser diode,
   a temperature of said second temperature-controlled substrate being controlled at a predetermined value.

7. The semiconductor laser diode module as set forth in claim 6, wherein the first and second portions of said light detector are arranged perpendicular to a surface of said second temperature-controlled substrate.

8. The semiconductor laser diode module as set forth in claim 6, wherein the first and second portions of said light detector are arranged in parallel with a surface of said second temperature-controlled substrate.

9. The semiconductor laser diode module as set forth in claim 1, further comprising:
   a temperature-controlled substrate mounting said semiconductor laser diode and said collimating lens;
   a non-temperature-controlled substrate mounting said bandpass filter and said light detector; and
   a temperature sensor for detecting a temperature of said non-temperature-controlled substrate;
   a temperature of said temperature-controlled substrate being controlled in accordance with the output signal of the second portion of said light detector to control the light intensity of said semiconductor laser diode,
   the output signal of the first portion of said light detector being corrected in accordance with the detected temperature of said non-temperature-controlled substrate.

10. The semiconductor laser diode module as set forth in claim 9, wherein the first and second portions of said light detector are arranged perpendicular to a surface of said non-temperature-controlled substrate.

11. The semiconductor laser diode module as set forth in claim 9, wherein the first and second portions of said light detector are arranged in parallel with a surface of said non-temperature-controlled substrate.

12. The semiconductor laser diode module as set forth in claim 1, wherein said semiconductor laser diode has no rear facet for emitting a light beam.

13. The semiconductor laser diode module as set forth in claim 12, wherein said semiconductor laser diode comprises a surface emitting semiconductor laser diode.

14. The semiconductor laser diode module as set forth in claim 12, wherein said semiconductor laser diode comprises a wavelength tunable semiconductor laser diode array.

15. The semiconductor laser diode module as set forth in claim 14, wherein said semiconductor laser diode further comprises:
   a light combiner for combining light beams of elements of said wavelength tunable semiconductor laser diode array; and
   an optical amplifier for amplifying an output of said light combiner.

16. The semiconductor laser diode module as set forth in claim 1, wherein said bandpass filter comprises an etalon.

17. The semiconductor laser diode module as set forth in claim 1, wherein said bandpass filter comprises a solid state bandpass filter.

18. The semiconductor laser diode module as set forth in claim 1, wherein said bandpass filter comprises an air-gap type bandpass filter.

19. A semiconductor laser diode module comprising:
   a semiconductor laser diode having a front facet for emitting a light beam;
   a collimating lens for receiving said light beam to generate a collimated light beam;
   a coupling lens for receiving said collimated light beam and converging said collimated light beam to an optical fiber;
   a bandpass filter for receiving a first part of said collimated light beam;
   a light detector having a first portion for receiving the first part of said collimated light beam through said bandpass filter and a second portion for receiving a second part of said collimated light beam;
   an isolator interposed between said collimating lens and said bandpass filter; and
   a temperature-controlled substrate mounting said semiconductor laser diode, said collimating lens, said isolator, said bandpass filter and said light detector,
   so that a wavelength of said semiconductor laser diode is controlled by changing a temperature of said temperature-controlled substrate in accordance with an output signal of the first portion of said light detector, and a light intensity of said semiconductor laser diode is controlled in accordance with an output signal of the second portion of said light detector.

20. A semiconductor laser diode module comprising:

a semiconductor laser diode having a front facet for emitting a light beam;

a collimating lens for receiving said light beam to generate a collimated light beam;

a coupling lens for receiving said collimated light beam and converging said collimated light beam to an optical fiber;

a bandpass filter for receiving a first part of said collimated light beam;

a light detector having a first portion for receiving the first part of said collimated light beam through said bandpass filter and a second portion for receiving a second part of said collimated light beam;

an isolator interposed between said collimating lens and said bandpass filter;

a first temperature-controlled substrate mounting said semiconductor laser diode, said collimating lens and said isolator; and a second temperature-controlled substrate mounting said bandpass filter and said light detector, so that a wavelength of said semiconductor laser diode is controlled by changing a temperature of said first temperature-controlled substrate in accordance with an output signal of the first portion of said light detector, and a light intensity of said semiconductor laser diode is controlled in accordance with an output signal of the second portion of said light detector, a temperature of said second temperature-controlled substrate being controlled at a predetermined value.

21. A semiconductor laser diode module comprising;

a semiconductor laser diode having a front facet for emitting a light beam;

a collimating lens for receiving said light beam to generate a collimated light beam;

a coupling lens for receiving said collimated light beam and converging said collimated light beam to an optical fiber;

a bandpass filter for receiving a first part of said collimated light beam;

a light detector having a first portion for receiving the first part of said collimated light beam through said bandpass filter and a second portion for receiving a second part of said collimated light beam;

an isolator interposed between said collimating lens and said bandpass filter;

a temperature-controlled substrate mounting said semiconductor laser diode, said collimating lens and said isolator; and a non-temperature-controlled substrate mounting said bandpass filter and said light detector, so that a wavelength of said semiconductor laser diode is controlled by changing a temperature of said temperature-control led substrate in accordance with an output signal of the first portion of said light detector, and a light intensity of said semiconductor laser diode is controlled in accordance with an output signal of the second portion of said light detector.

* * * * *